United States Patent
Cheng et al.

(10) Patent No.: US 12,501,550 B2
(45) Date of Patent: Dec. 16, 2025

(54) PRINTED CIRCUIT BOARD AND MANUFACTURING METHOD THEREOF

(71) Applicant: Beijing Zitiao Network Technology Co., Ltd., Beijing (CN)

(72) Inventors: Chuansheng Cheng, Beijing (CN); Dayong Shen, Beijing (CN); Jian Wang, Beijing (CN)

(73) Assignee: Beijing Zitiao Network Technology Co., Ltd., Beijing (CN)

( * ) Notice: Subject to any disclaimer, the term of this patent is extended or adjusted under 35 U.S.C. 154(b) by 0 days.

(21) Appl. No.: 19/002,570

(22) Filed: Dec. 26, 2024

(65) Prior Publication Data
US 2025/0311104 A1 Oct. 2, 2025

(30) Foreign Application Priority Data
Mar. 27, 2024 (CN) .......................... 202410362817.7

(51) Int. Cl.
| | |
|---|---|
| H05K 1/02 | (2006.01) |
| H05K 1/11 | (2006.01) |
| H05K 3/40 | (2006.01) |

(52) U.S. Cl.
CPC ............ H05K 1/115 (2013.01); H05K 1/025 (2013.01); H05K 1/0298 (2013.01);
(Continued)

(58) Field of Classification Search
CPC ...... H05K 1/115; H05K 1/025; H05K 1/0298; H05K 3/4038; H05K 2201/093;
(Continued)

(56) References Cited

U.S. PATENT DOCUMENTS

| | | | |
|---|---|---|---|
| 2002/0084105 A1* | 7/2002 | Geng | H05K 3/3436 |
| | | | 174/261 |
| 2003/0178229 A1* | 9/2003 | Toyoda | H05K 3/4688 |
| | | | 174/261 |

(Continued)

FOREIGN PATENT DOCUMENTS

| | | |
|---|---|---|
| CN | 104517933 A | 4/2015 |
| CN | 105578714 A | 5/2016 |

(Continued)

OTHER PUBLICATIONS

International Search Report from PCT/CN2024/141637, dated Jan. 28, 2025, 5 pages with machine-generated translation.

*Primary Examiner* — Steven T Sawyer
(74) *Attorney, Agent, or Firm* — BakerHostetler

(57) ABSTRACT

According to embodiments of the present disclosure, a printed circuit and manufacturing method thereof are provided. The printed circuit board comprises: a signal plane portion comprising a plurality of metal layers for transmitting a signal; a power plane portion overlaid with the signal plane portion through a connection layer and comprising a plurality of metal layers for providing power; a plurality of power vias each extending from a surface of the signal plane portion facing away from the power plane portion, through the signal plane portion, the connection layer, and the power plane portion, to a surface of the power plane portion facing away from the signal plane portion; and a plurality of signal vias each extending from a surface of the signal plane portion facing away from the power plane portion into the signal plane portion and not into the power plane portion.

14 Claims, 8 Drawing Sheets

(52) U.S. Cl.
CPC ..... *H05K 3/4038* (2013.01); *H05K 2201/093* (2013.01); *H05K 2201/09481* (2013.01); *H05K 2201/09672* (2013.01)

(58) Field of Classification Search
CPC ............... H05K 1/0251; H05K 3/4679; H05K 2201/09363; H05K 2201/09454; H05K 2201/09481; H05K 2201/09672; H05K 2201/097; H05K 2201/09718; H05K 2201/09727; H05K 1/116
See application file for complete search history.

(56) References Cited

U.S. PATENT DOCUMENTS

| | | | |
|---|---|---|---|
| 2005/0191785 A1* | 9/2005 | Howard | H01L 23/66 257/E23.024 |
| 2009/0108469 A1* | 4/2009 | Kang | H01L 25/0657 257/777 |
| 2015/0373847 A1* | 12/2015 | Wells | H05K 3/3436 29/830 |
| 2022/0141952 A1* | 5/2022 | Reynov | H05K 1/0218 361/794 |
| 2023/0319985 A1* | 10/2023 | Noujeim | H05K 1/0298 174/251 |
| 2023/0352383 A1* | 11/2023 | Saraswat | H01L 23/49838 |
| 2025/0031300 A1* | 1/2025 | Sapozhnikov | H05K 3/429 |

FOREIGN PATENT DOCUMENTS

| | | |
|---|---|---|
| CN | 211429623 U | 9/2020 |
| CN | 214481451 U | 10/2021 |
| CN | 116896813 A | 10/2023 |
| CN | 119095258 A | 12/2024 |

* cited by examiner

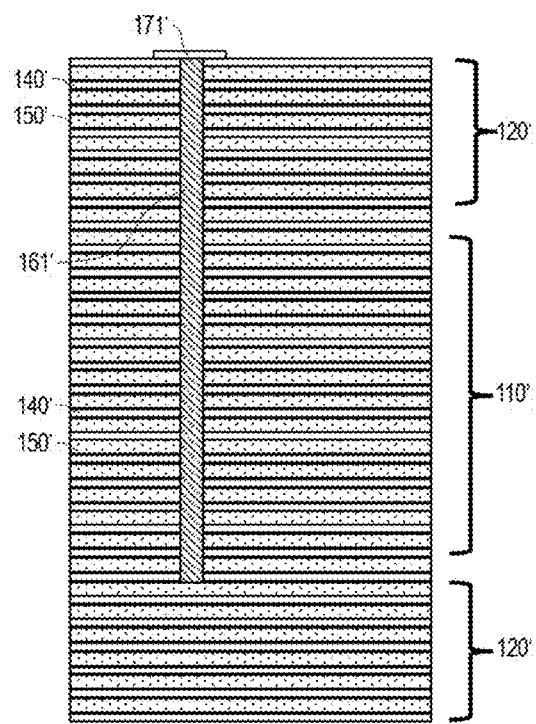
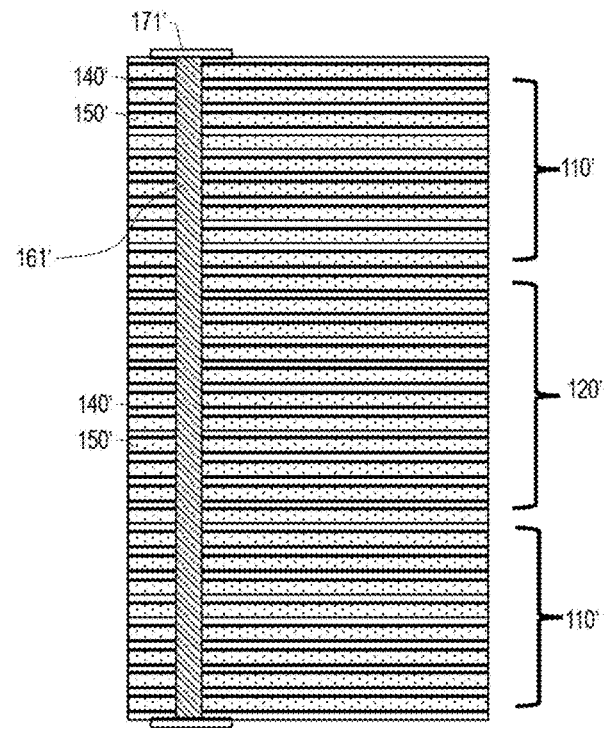
FIG. 1A
FIG. 1B
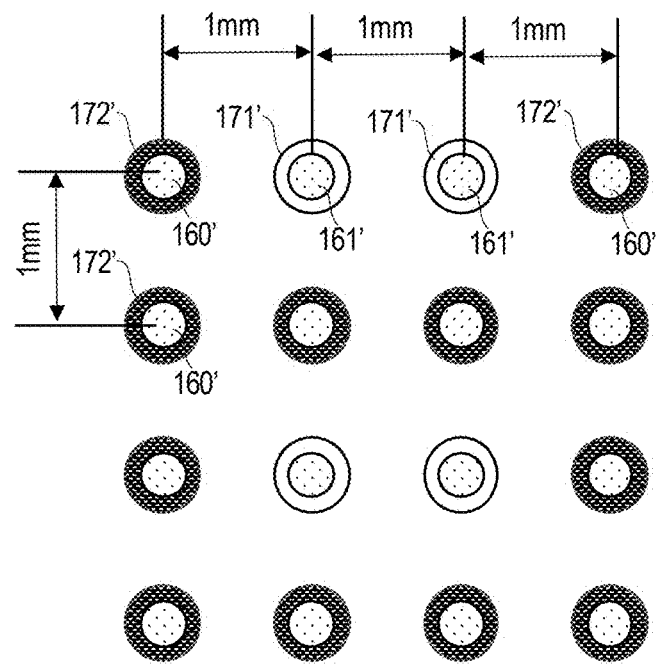
FIG. 2A

PRINTED CIRCUIT BOARD AND MANUFACTURING METHOD THEREOF

CROSS REFERENCE TO RELATED APPLICATION

This application claims the benefit of Chinese Application No. 202410362817.7, filed on Mar. 27, 2024, the disclosure of which is incorporated herein by reference in its entirety.

FIELDS

Embodiments of the present disclosure generally relate to the technical field of electronic devices, and more particularly, to a printed circuit board and manufacturing method thereof.

BACKGROUND

The continuously increasing rate of a signal transmitted by an integrated circuit chip(s) leads to a further increase in the bandwidth required by a channel. In order to meet this requirement, the chip dimension grows continuously, the number of signal pins of a chip increases unceasingly, and the spacing between the pins decreases unceasingly. The increase in the number of signal pins of the chip results in the need for more signal planes, while the increased power consumption of the chip requires more power planes.

In this case, vias in a printed circuit board (PCB) carrying a chip will be denser, thus requiring vias with a smaller diameter. In addition, due to the increase in bandwidth and the reduction in pin spacing, crosstalk between signals becomes more difficult to control, and additional via shielding is required to solve the crosstalk problem. Moreover, the increase in the number of layers of signal planes results in a thicker PCB, which increases the length of signal vias. In addition to the signal plane, more power planes are needed to ensure the current capability of the chip, which further increases the PCB thickness. Furthermore, the increase of the board thickness and the decrease of the diameter of the via may result in an increase in a ratio of the board thickness to the diameter of the via (also referred to as aspect ratio herein), which increases the manufacturing difficulty of vias and affects the yield of PCB processing. Last but not least, the decrease of the diameter of via causes the inductive load of the via to continuously increase, so that the reflection of a signal via is excessive and the signal integrity of the chip is affected. Meanwhile, dense signal vias may affect the current capability of the chip.

SUMMARY

In one aspect of the present disclosure, a printed circuit board is provided, comprising: a signal plane portion comprising a plurality of metal layers for transmitting a signal; a power plane portion overlaid with the signal plane portion through a connection layer and comprising a plurality of metal layers for providing power; a plurality of power vias each extending from a surface of the signal plane portion facing away from the power plane portion, through the signal plane portion, the connection layer, and the power plane portion, to a surface of the power plane portion facing away from the signal plane portion; and a plurality of signal vias each extending from a surface of the signal plane portion facing away from the power plane portion into the signal plane portion and not into the power plane portion, wherein a radial dimension of each of the plurality of signal vias is smaller than a radial dimension of each of the plurality of power vias.

In another aspect of the present disclosure, a method for manufacturing a printed circuit board is provided, comprising: forming a signal plane portion comprising a plurality of metal layers for transmitting a signal; forming a plurality of signal vias in the signal plane portion, the plurality of signal vias respectively extending from a surface of the signal plane portion into the signal plane portion; forming a power plane portion comprising a plurality of metal layers for providing power; overlaying the power plane portion with the signal plane portion through a connection layer, wherein the surface of the signal plane portion faces away from the power plane portion; and forming a plurality of power vias in the signal plane portion and the power plane portion, the plurality of power vias respectively extending from the surface of the signal plane portion to a surface of the power plane portion facing away from the signal plane portion, wherein a radial dimension of each of the plurality of signal vias is smaller than a radial dimension of each of the plurality of power vias.

It should be understood that the content described in this summary section is not intended to limit key features or important features of the embodiments of the present disclosure, nor is it intended to limit the scope of the present disclosure. Other features of the present disclosure will become readily understood from the following description.

BRIEF DESCRIPTION OF THE DRAWINGS

The above and other features, advantages, and aspects of various embodiments of the present disclosure will become more apparent from the following detailed description taken in conjunction with the accompanying drawings. In the drawings, the same or similar reference numerals refer to the same or similar elements, wherein:

FIG. 1A and FIG. 1B illustrate schematic cross-sectional views of a conventional printed circuit board;

FIG. 2A to FIG. 2D illustrate example arrangements of conventional pads and vias;

Figure 2B:
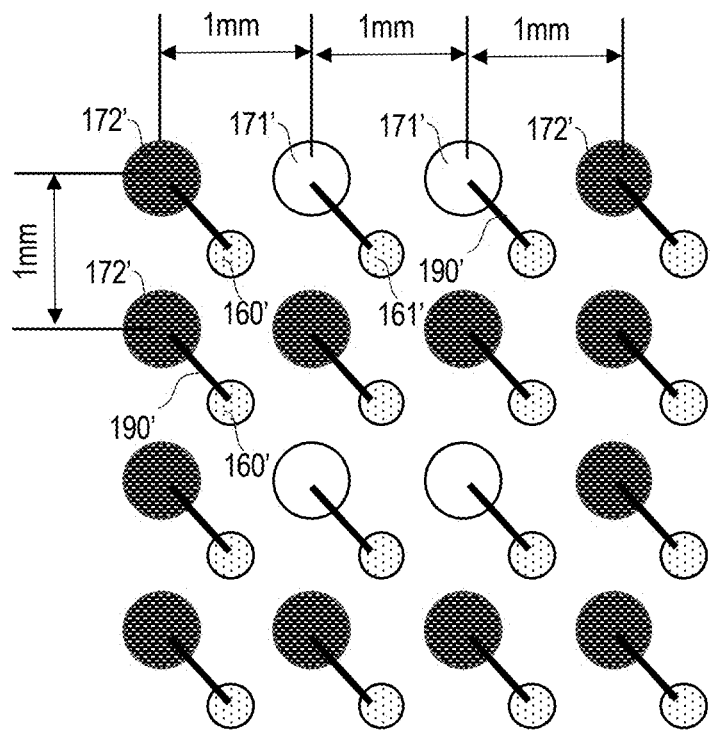

REFERENCE NUMERALS INDICATE 100 printed circuit board;
110, 110' signal plane portion;
111 first surface;
112 second surface;
140, 140' metal layer;
150, 150' dielectric layer;
120, 120' power plane portion;
123 third surface;
124 fourth surface;
130 connection layer;
160, 160' power via;
161, 161' signal via;
1611 first signal via;
1612 second signal via;
171, 171' signal pad;

172, 172' power pad;
180 capacitive load pad;
181 first end;
182 second end;
183 third end;
184 fourth end;
190, 190' trace.

DETAILED DESCRIPTION

Embodiments of the present disclosure will be described in more detail below with reference to the accompanying drawings. Although some embodiments of the present disclosure are shown in the drawings, it should be understood that the present disclosure may be implemented in various forms and should not be limited by the embodiments described herein. On the contrary, these embodiments are provided to make this disclosure more thorough and complete, and to fully convey the scope of the present disclosure to those skilled in the art.

As used herein, the term "comprising" and its variations mean openness, i.e., "comprising but not limited to". Unless specifically stated, the term "or" means "and/or". The term "based on" means "based at least in part on". The terms "an example embodiment" and "an embodiment" mean "at least one example embodiment". The term "a further embodiment" means "at least one further embodiment". The terms "first", "second", and the like may refer to different or identical objects.

As briefly mentioned above, vias in a PCB are becoming denser, thus requiring vias with a smaller diameter. In addition, due to the increase in bandwidth and the reduction in pin spacing, crosstalk between signals becomes more difficult to control, and additional via shielding is required to solve the crosstalk problem. Moreover, the increase in the number of layers of signal planes results in a thicker PCB, which increases the length of signal vias. In addition to the signal plane, more power planes are needed to ensure the current capability of the chip, which further increases the PCB thickness. Furthermore, the increase of the board thickness and the decrease of the diameter of the via may result in an increase in a ratio of the board thickness to the diameter of the via (also referred to as aspect ratio herein), which increases the manufacturing difficulty of vias and affects the yield of PCB processing. Last but not least, the decrease of the diameter of via causes the inductive load of the via to continuously increase, so that the reflection of a signal via is excessive and the signal integrity of the chip is affected. Meanwhile, dense signal vias may affect the current capability of the chip. This will be described in further detail below with reference to FIG. 1A to FIG. 2D. FIG. 1A and FIG. 1B illustrate schematic cross-sectional views of a conventional printed circuit board. FIG. 2A to FIG. 2D illustrate example arrangements of conventional pads and vias.

As shown in FIG. 1A, a conventional printed circuit board includes a signal plane portion 110' and a power plane portion 120' on both sides of the signal plane portion 110'. The signal plane portion 110' and the two power plane portions 120' form a symmetrical layered structure through one lamination. The signal plane portion 110' and the two power plane portions 120' each include a plurality of metal layers 140' and dielectric layers 150' between adjacent metal layers 140'. The signal via 161' extends from the surface of the power plane portion 120' into the signal plane portion 110'. The surface of the power plane portion 120' is provided with a signal pad 171' connected to the signal via 161'. The maximum length of the signal via 161' is the overall board thickness of the printed circuit board minus the thickness of the underlying power plane portion 120'. As an example, when the board thickness of the printed circuit board is 6 millimeters (mm) and the thickness of each power plane portion 120' is 1.5 mm, the maximum length of the signal via 161' is 4.5 mm.

As shown in FIG. 1B, another conventional printed circuit board includes a power plane portion 120' and a signal plane portion 110' on both sides of the power plane portion 120'. The power plane portion 120' and the two signal plane portions 110' form a symmetrical layered structure through one lamination. The power plane portion 120' and the two signal plane portions 110' each include a plurality of metal layers 140' and dielectric layers 150' between adjacent metal layers 140'. The signal via 161' extends from the surface of one signal plane portion 110' to the surface of another signal plane portion 110'. The surface of the signal plane portion 110' is provided with a signal pad 171' connected to the signal via 161'. The maximum length of the signal vias 161' is the overall board thickness of the printed circuit board. As an example, when the board thickness of the printed circuit board is 6 mm, the maximum length of the signal via 161' is 6 mm.

It should be noted that the numbers, values, etc., which are mentioned above and may be mentioned elsewhere in the present disclosure, are examples and are not intended to limit the scope of the present disclosure in any manner. Any other suitable number or value is possible.

As shown in FIG. 2A, a plurality of signal pads 171' and a plurality of power pads 172' may be arranged in arrays. Each of the signal pads 171' and the power pads 172' may have a diameter of 0.5 mm, and the spacing between adjacent pads may be 1 mm. A signal via 161' is provided at a center of each signal pad 171', and a power via 160' is provided at a center of each power pad 172'. Each of the signal vias 161' and the power vias 160' may have a diameter of 0.3 mm. The spacing between adjacent vias may also be 1 mm.

As shown in FIG. 2B, the plurality of signal pads 171' and the plurality of power pads 172' may be arranged in arrays. Each of the signal pads 171' and the power pads 172' may have a diameter of 0.5 mm, and the spacing between adjacent pads may be 1 mm. A corresponding signal via 161' is provided outside each signal pad 171', and the signal via 161' is connected to the signal pad 171' through a trace 190'. A power via 160' is provided outside each power pad 172', and the power via 160' is connected to the power pad 172' through a trace 190'. Each of the signal vias 161' and the power vias 160' may have a diameter of 0.3 mm. The spacing between adjacent vias may also be 1 mm.

Each of the signal vias 161' and the power vias 160' shown in FIG. 2A and FIG. 2B may be formed in a printed circuit board through a drilling tool with a radial dimension of 0.3 mm.

Figure 2C:
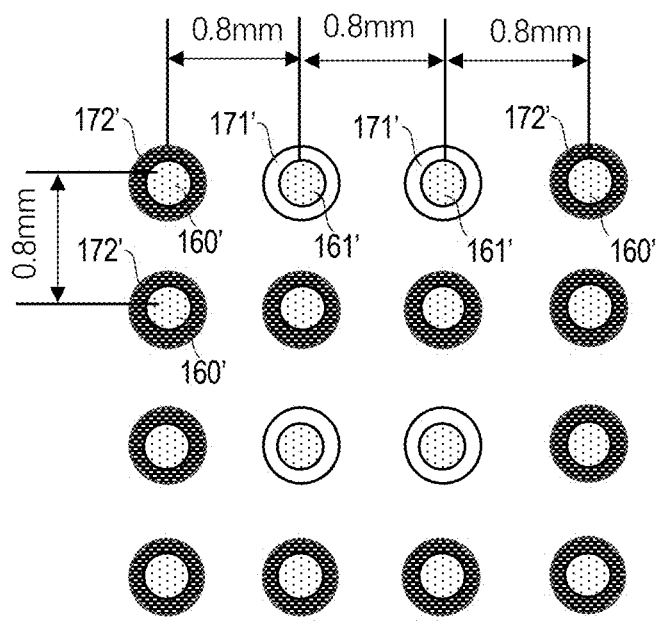

As shown in FIG. 2C, the spacing between adjacent pads of signal pads 171' and power pads 172' is further reduced as the pin density of the chip and the signal rate increases. For example, in a case where the pad diameter is 0.5 mm, the spacing between adjacent pads may be 0.8 mm. The decreased spacing between adjacent pads results in more difficult control of crosstalk between the signals. In addition, in a case where the dimension of the pad and the dimension of the via are unchanged, the decreased spacing between the vias may cause the impedance deviation of the vias to increase.

Figure 2D:
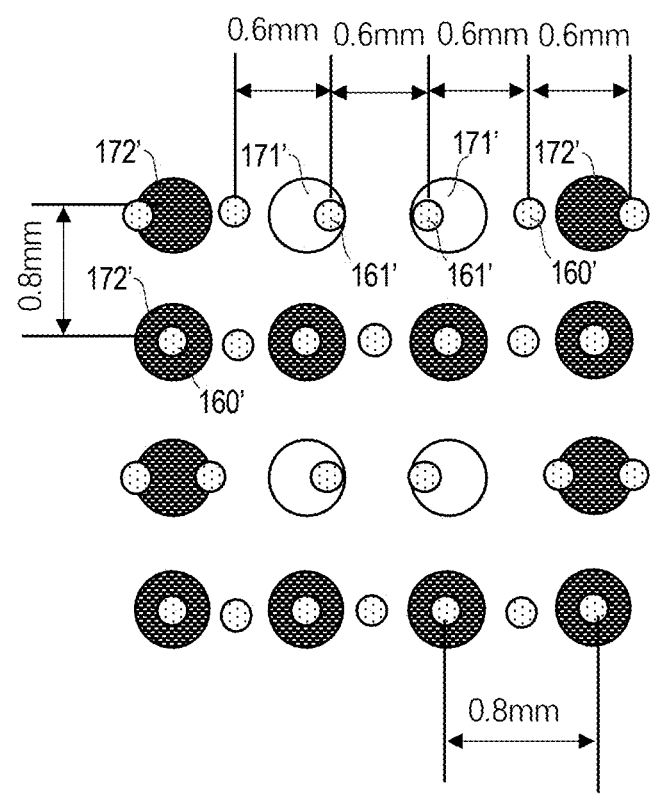

In order to reduce the crosstalk between signals caused by the decrease of the spacing between the vias, the spacing between the vias and the via diameter may be reduced to optimize the shielding effect. As shown in FIG. 2D, in a case where the pad diameter is 0.5 mm and the spacing between adjacent pads is 0.8 mm, each of the signal vias 161' and the power vias 160' may have a diameter of 0.2 mm, and the spacing between adjacent vias may be reduced to 0.6 mm. When the board thickness of the printed circuit board is large, the aspect ratio of the printed circuit board will be too large. For example, when the board thickness of the printed circuit board is 6 mm and the diameter of the via is 0.2 mm, the aspect ratio is 30:1. In addition, the tapering of the via causes the inductive load of the signal via 161' to continuously increase, so that the reflection of the signal via 161' is too large, which affects the signal integrity of the chip. Moreover, dense signal vias 161' may affect the current capability of the chip.

The embodiments of the present disclosure provide a printed circuit board and manufacturing method thereof, so that a smaller diameter of a signal via is realized, the distance between vias is reduced, the processing yield of a circuit board is improved, the crosstalk between signals is reduced, the inductive load is reduced, the signal integrity is ensured, and the current capacity is improved. Embodiments of the present disclosure will be described below with reference to FIG. 3 to FIG. 5E.

Figure 3:
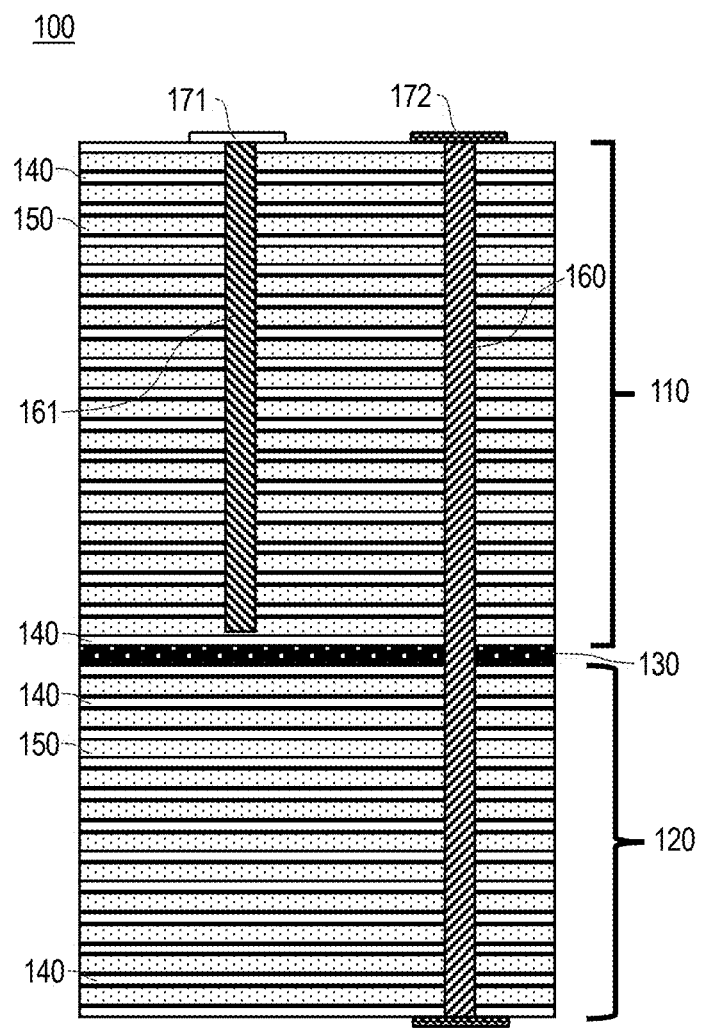
FIG. 3 illustrates a schematic cross-sectional view of a printed circuit board according to some embodiments of the present disclosure.

FIG. 3 illustrates a schematic cross-sectional view of a printed circuit board according to some embodiments of the present disclosure. As shown in FIG. 3, the printed circuit board 100 described herein generally includes a signal plane portion 110, a power plane portion 120, a connection layer 130, a plurality of power vias 160, and a plurality of signal vias 161.

The signal plane portion 110 includes a plurality of metal layers 140 for transmitting a signal(s). Adjacent metal layers 140 of the signal plane portion 110 are separated through a dielectric layer 150. Similarly, the power plane portion 120 includes a plurality of metal layers 140 for providing power. Adjacent metal layers 140 of the power plane portion 120 are separated through a dielectric layer 150. The connection layer 130 is provided between the power plane portion 120 and the signal plane portion 110 to join the two portions together such that the power plane portion 120 and the signal plane portion 110 are overlaid with each other. Different from the symmetrical layered structure of the printed circuit board shown in FIG. 1A and FIG. 1B, the printed circuit board 100 shown in FIG. 3 is an asymmetric layered structure. When the printed circuit board 100 is placed along the orientation shown in FIG. 3, the signal plane portion 110 is located above the power plane portion 120. It will be appreciated that the power plane portion 120 and the signal plane portion 110 may have other relative positional relationships when the printed circuit board 100 is placed in other orientations.

As shown in FIG. 3, a power via 160 extends from a surface of the signal plane portion 110 facing away from the power plane portion 120, through the signal plane portion 110, the connection layer 130, and the power plane portion 120, to a surface of the power plane portion 120 facing away from the signal plane portion 110. The power via 160 may be electrically connected to the power plane portion 120 and the metal layer 140 in the signal plane portion 110. FIG. 3 shows only one single power via 160 as an example to illustrate the principles of the present disclosure. It should be understood that other power vias 160 may also have similar arrangements, i.e., extend from a surface of the signal plane portion 110 facing away from the power plane portion 120 to a surface of the power plane portion 120 facing away from the signal plane portion 110.

As shown in FIG. 3, the surfaces of the signal plane portion 110 and the power plane portion 120 may be provided with power pads 172 electrically connected to the power via 160 to connect with a corresponding pin on the chip.

As shown in FIG. 3, a signal via 161 extends from a surface of the signal plane portion 110 facing away from the power plane portion 120 into the signal plane portion 110 and not into the power plane portion 120. The signal via 161 may be electrically connected to the metal layer 140 in the signal plane portion 110. FIG. 3 shows only one single signal via 161 as an example to illustrate the principles of the present disclosure. It should be understood that other signal vias 161 may also have similar arrangements, i.e., extend from a surface of the signal plane portion 110 facing away from the power plane portion 120 into the signal plane portion 110, and not into the power plane portion 120. A radial dimension of each of the plurality of signal vias 161 is smaller than a radial dimension of each of the plurality of power vias 160. For example, when the radial dimension of the power via 160 is 0.3 mm, the radial dimension of the signal via 161 may be 0.2 mm.

As shown in FIG. 3, the surface of the signal plane portion 110 may be provided with a signal pad 171 electrically connected to the signal via 161 to connect with a corresponding pin on the chip.

As an example, the overall thickness of the printed circuit board 100 may be 6 mm, wherein the thickness of the power plane portion 120 is approximately 3.5 mm, the thickness of the signal plane portion 110 is approximately 2.5 mm, and the thickness of the connection layer 130 is small and thus may be negligible. In this case, the aspect ratio of the signal plane portion 110 to the signal via 161 is 17.5:1, which is reduced by 41% compared to the aspect ratio of 30:1. The reduction of the aspect ratio can reduce the processing difficulty of the printed circuit board 100 and improve the processing yield.

In some embodiments, the signal plane portion 110 is formed during a first lamination process, the power plane portion 120 is formed during a second lamination process, and the signal plane portion 110 and the power plane portion 120 are overlaid together through the connection layer 130 during a third lamination process. The plurality of signal vias 161 are formed in the power plane portion 120 after the first lamination process and before the third lamination process, and the plurality of power vias 160 are formed in the signal plane portion 110 and the power plane portion 120 after the third lamination process. By separately laminating the signal plane portion 110 and the power plane portion 120, the signal via 161 with a smaller diameter can be pre-formed in the signal plane portion 110, and the spacing between the signal vias 161 can be reduced, thereby the crosstalk problem between signals can be solved.

In some embodiments, as shown in FIG. 3, at least one signal via 161 extends from a surface of the signal plane portion 110 facing away from the power plane portion 120 to a metal layer 140, that is adjacent to the connection layer 130, of the plurality of metal layers 140 of the signal plane portion 110. Certainly, some of the plurality of signal vias 161 may also extend from a surface of the signal plane portion 110 facing away from the power plane portion 120 to an intermediate metal layer 140 of the signal plane portion 110.

Figure 4A:
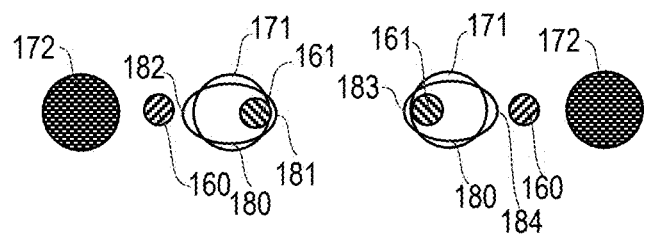
FIG. 4A and FIG. 4B illustrate example arrangements of capacitive load pads relative to vias.
Figure 4B:
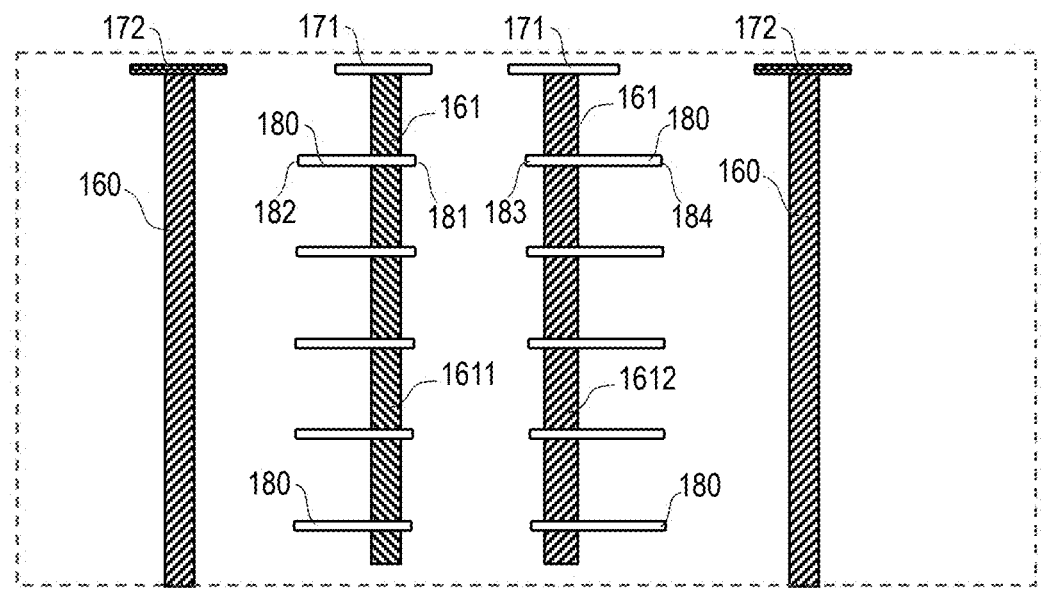

As described above, the decrease of the diameter of the signal via causes the inductive load of the via to continuously increase, so that the signal via reflection is excessive, and the signal integrity of the chip is affected. Meanwhile, dense signal vias may affect the current capacity of the chip. To this end, capacitive load pads may be provided in the signal plane portion 110 to mitigate signal reflection caused by inductive load. FIG. 4A and FIG. 4B illustrate example arrangements of capacitive load pads relative to vias.

In some embodiments, as shown in FIG. 4A and FIG. 4B, a plurality of capacitive load pads 180 are formed in the plurality of metal layers 140 of the signal plane portion 110 and are electrically connected to at least a part of the plurality of signal vias 161. In some embodiments, a capacitive load pad 180 may be provided in each metal layer 140 of the signal plane portion 110. In some embodiments, the capacitive load pad 180 may be provided only in a part of the metal layers 140 of the signal plane portion 110. The capacitive load pad 180 connected to each signal via 161 may form a capacitor. FIG. 4A and FIG. 4B show only two signal vias 161 as an example to illustrate the arrangement of the capacitive load pads 180. It should be understood that other signal vias 161 may also be connected to the corresponding capacitive load pads 180. By providing the capacitive load pad 180, the problem of excessive signal reflection caused by the inductive load can be solved, and the integrity of the signal can be ensured.

In some embodiments, as shown in FIG. 4A and FIG. 4B, at least one pair of adjacent signal vias 161 of the plurality of signal vias 161 may be respectively connected to at least two capacitive load pads 180 of the plurality of capacitive load pads 180. Each pair of adjacent signal vias 161 of the at least one pair of adjacent signal vias 161 may include a first signal via 1611 and a second signal via 1612. The at least two capacitive load pads 180 connected by the first signal via 1611 may be offset in a direction away from the corresponding second signal via 1612, and the at least two capacitive load pads 180 connected by the second signal via 1612 may be offset in a direction away from the corresponding first signal via 1611. By offsetting the capacitive load pads 180, a smaller space can be achieved between adjacent signal vias 161, and a short circuit between adjacent signal vias 161 can be avoided.

In some embodiments, as shown in FIG. 4A and FIG. 4B, each of the plurality of capacitive load pads 180 is elliptical. Each of the at least two capacitive load pads 180 connected by the first signal via 1611 has a first end 181 and a second end 182 along a long axis direction. The first end 181 is closer to the second signal via 1612 than the second end 182, and the first end 181 is closer to the first signal via 1611 than the second end 182. Each of the at least two capacitive load pads 180 connected by the second signal via 1612 has a third end 183 and a fourth end 184 along a long axis direction, the third end 183 is closer to the first signal via 1611 than the fourth end 184, and the third end 183 is closer to the second signal via 1612 than the fourth end 184. With this arrangement, the inductive load of the adjacent signal vias 161 can be reliably reduced, and a smaller spacing can be achieved, so that the occurrence of a short circuit can be avoided.

It should be understood that a capacitive load pad 180 may have any other suitable shape, such as a circle, a polygon, or the like.

Next, an example manufacturing process of the printed circuit board 100 will be described with reference to FIGS. 5A-5E.

Figure 5A:
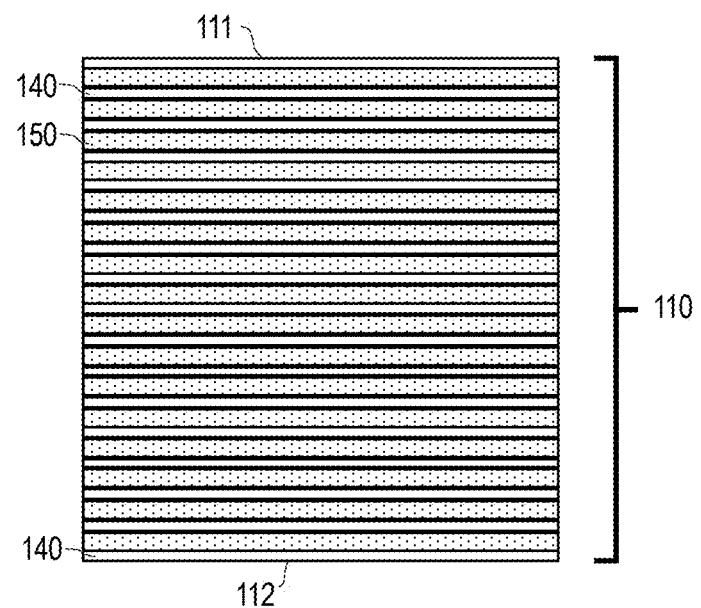
FIG. 5A to FIG. 5E illustrate a manufacturing process of a printed circuit board according to some embodiments of the present disclosure.

As shown in FIG. 5A, a signal plane portion 110 is formed. The signal plane portion 110 includes a plurality of metal layers 140 for transmitting a signal(s). Adjacent metal layers 140 of the signal plane portion 110 are separated through a dielectric layer 150. The signal plane portion 110 includes a first surface 111 and a second surface 112 opposite to each other.

Figure 5B:
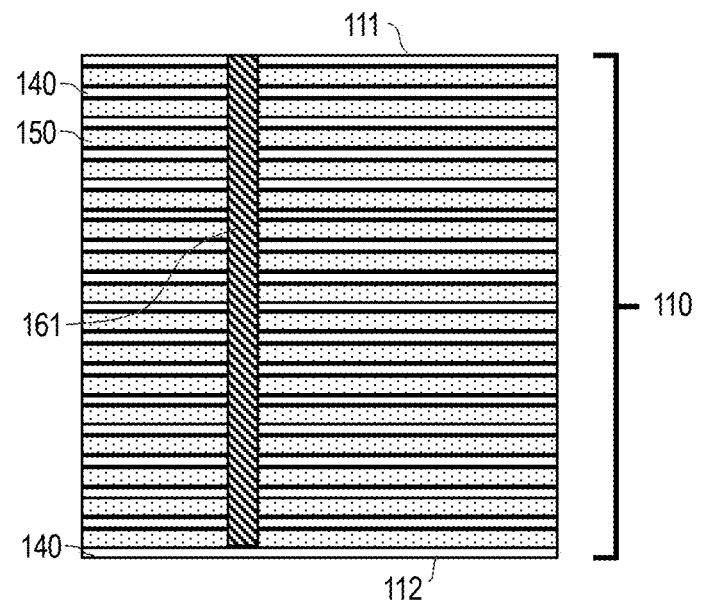

As shown in FIG. 5B, a plurality of signal vias 161 are formed in the signal plane portion 110, and the plurality of signal vias 161 respectively extend from the first surface 111 of the signal plane portion 110 into the signal plane portion 110. FIG. 5B shows only one single signal via 161 as an example to illustrate the principles of the present disclosure. It should be understood that other signal vias 161 may also have similar arrangements.

In some embodiments, as shown in FIG. 5B, at least one signal via 161 extends from the first surface 111 of the signal plane portion 110 to a metal layer 140, that is adjacent to the second surface 112, of the plurality of metal layers 140 of the signal plane portion 110. Certainly, some of the plurality of signal vias 161 may also extend from the first surface 111 of the signal plane portion 110 to an intermediate metal layer 140 of the signal plane portion 110.

Figure 5C:
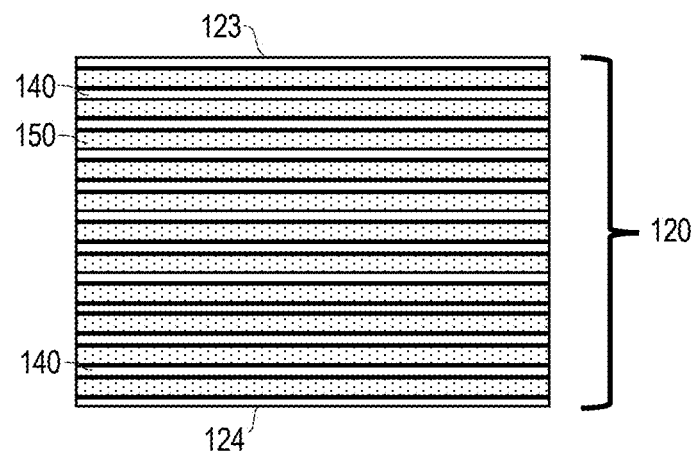

In some embodiments, a power plane portion 120 is formed as shown in FIG. 5C. The power plane portion 120 includes a plurality of metal layers 140 for providing power. Adjacent metal layers 140 of the power plane portion 120 are separated through a dielectric layer 150. The power plane portion 120 includes a third surface 123 and a fourth surface 124 opposite to each other.

Figure 5D:
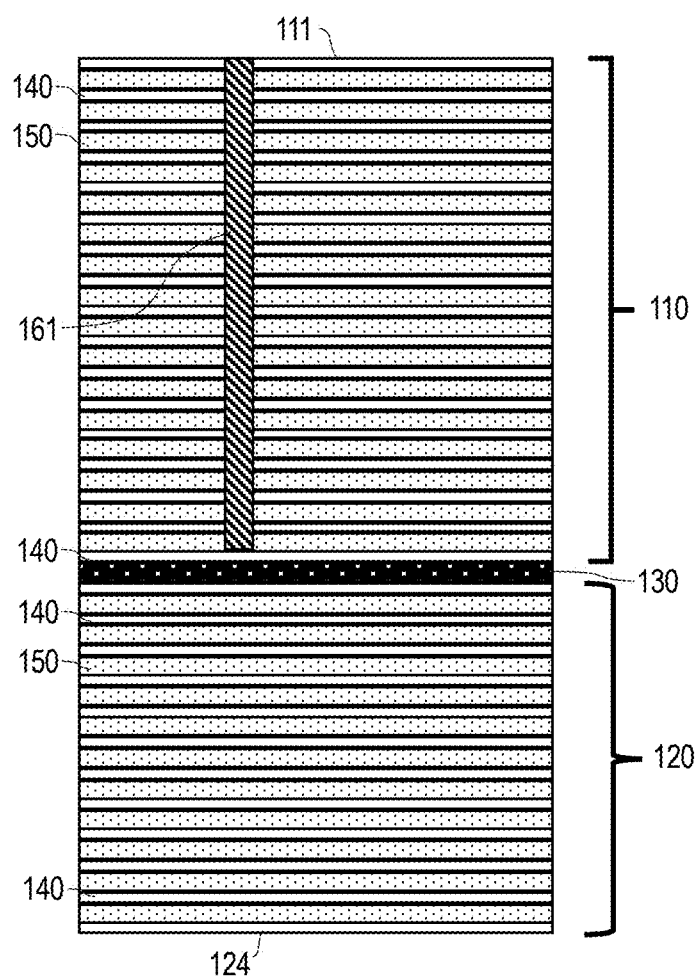

As shown in FIG. 5D, the power plane portion 120 is overlaid with the signal plane portion 110 through a connection layer 130. The first surface 111 of the signal plane portion 110 faces away from the power plane portion 120.

Figure 5E:
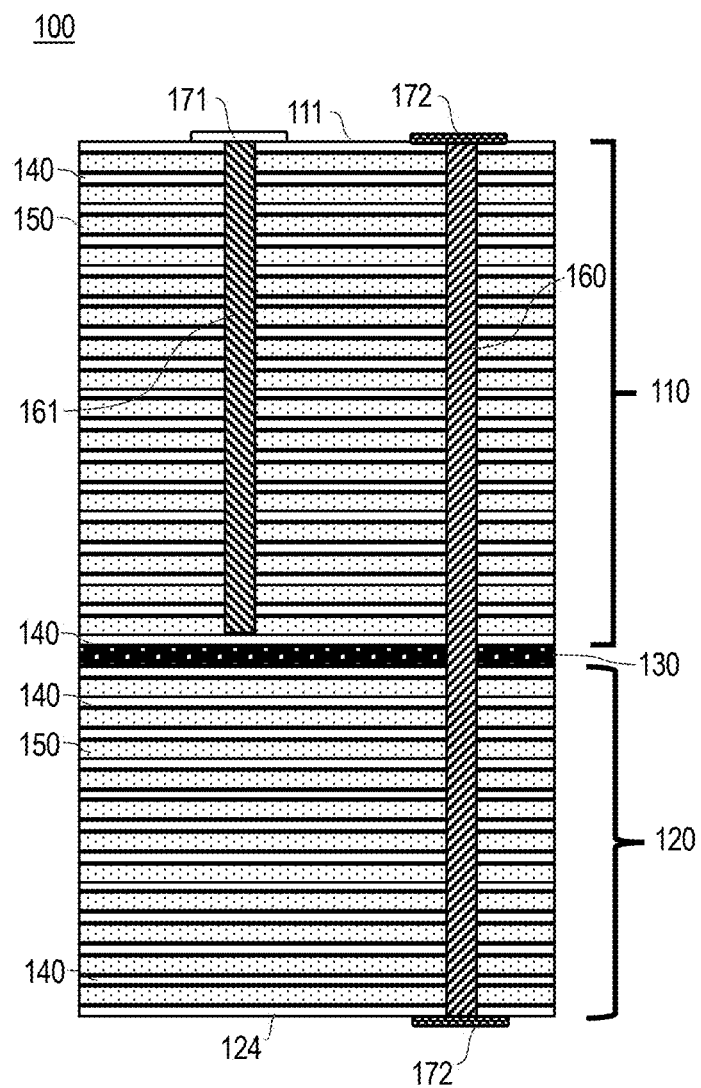

As shown in FIG. 5E, a plurality of power vias 160 are formed in the signal plane portion 110 and the power plane portion 120. The plurality of power vias 160 extend from the first surface 111 of the signal plane portion 110 to the fourth surface 124 of the power plane portion 120 facing away from the signal plane portion 110, respectively. A radial dimension of each of the plurality of signal vias 161 is smaller than a radial dimension of each of the plurality of power vias 160.

In some embodiments, the signal plane portion 110 is formed during a first lamination process, the power plane portion 120 is formed during a second lamination process, and the signal plane portion 110 and the power plane portion 120 are overlaid together through the connection layer 130 during a third lamination process.

In some embodiments, forming the signal plane portion 110 further comprises: forming a plurality of capacitive load pads 180 in the plurality of metal layers 140 of the signal plane portion 110, as shown in FIG. 4A and FIG. 4B. The plurality of capacitive load pads 180 are adapted to be electrically connected to at least a part of the plurality of signal vias 161.

In some embodiments, at least one pair of adjacent signal vias 161 of the plurality of signal vias 161 are respectively connected to at least two capacitive load pads 180 of the plurality of capacitive load pads 180. Each pair of adjacent signal vias 161 of the at least one pair of adjacent signal vias 161 comprises a first signal via 1611 and a second signal via 1612. The at least two capacitive load pads 180 connected by the first signal via 1611 are offset in a direction away from the corresponding second signal via 1612, and the at least two capacitive load pads 180 connected by the second signal via 1612 are offset in a direction away from the corresponding first signal via 1611.

In some embodiments, each of the plurality of capacitive load pads 180 is elliptical. Each of the at least two capacitive load pads 180 connected by the first signal via 1611 has a first end and a second end along a long axis direction. The first end is closer to the second signal via 1612 than the second end, and the first end is closer to the first signal via 1611 than the second end. In addition, each of the at least two capacitive load pads 180 connected by the second signal via 1612 has a third end and a fourth end along a long axis direction. The third end is closer to the first signal via 1611 than the fourth end, and the third end is closer to the second signal via 1612 than the fourth end.

Embodiments of the present disclosure are also embodied in the following examples.

Example 1

A printed circuit board, comprising:
- a signal plane portion comprising a plurality of metal layers for transmitting a signal;
- a power plane portion overlaid with the signal plane portion through a connection layer and comprising a plurality of metal layers for providing power;
- a plurality of power vias each extending from a surface of the signal plane portion facing away from the power plane portion, through the signal plane portion, the connection layer, and the power plane portion, to a surface of the power plane portion facing away from the signal plane portion; and
- a plurality of signal vias each extending from a surface of the signal plane portion facing away from the power plane portion into the signal plane portion and not into the power plane portion, wherein a radial dimension of each of the plurality of signal vias is smaller than a radial dimension of each of the plurality of power vias.

Example 2

The printed circuit board of example 1, wherein the signal plane portion is formed during a first lamination process, the power plane portion is formed during a second lamination process, and the signal plane portion and the power plane portion are overlaid together through the connection layer during a third lamination process, and
- wherein the plurality of signal vias are formed in the power plane portion after the first lamination process and before the third lamination process, and the plurality of power vias are formed in the signal plane portion and the power plane portion after the third lamination process.

Example 3

The printed circuit board of example 1, wherein at least one signal via of the plurality of signal vias extends from a surface of the signal plane portion facing away from the power plane portion to a metal layer, that is adjacent to the connection layer, of the plurality of metal layers of the signal plane portion.

Example 4

The printed circuit board of any of examples 1 to 3, further comprising:
- a plurality of capacitive load pads being formed in the plurality of metal layers of the signal plane portion and being electrically connected to at least a part of the plurality of signal vias.

Example 5

The printed circuit board of example 4, wherein at least one pair of adjacent signal vias of the plurality of signal vias are respectively connected to at least two capacitive load pads of the plurality of capacitive load pads, each pair of adjacent signal vias of the at least one pair of adjacent signal vias comprises a first signal via and a second signal via, the at least two capacitive load pads connected by the first signal via are offset in a direction away from the corresponding second signal via, and the at least two capacitive load pads connected by the second signal via are offset in a direction away from the corresponding first signal via.

Example 6

The printed circuit board of example 5, wherein each of the plurality of capacitive load pads is elliptical,
- wherein each of the at least two capacitive load pads connected by the first signal via has a first end and a second end along a long axis direction, the first end is closer to the second signal via than the second end, and the first end is closer to the first signal via than the second end, and
- wherein each of the at least two capacitive load pads connected by the second signal via has a third end and a fourth end along a long axis direction, the third end is closer to the first signal via than the fourth end, and the third end is closer to the second signal via than the fourth end.

Example 7

A method for manufacturing a printed circuit board, comprising:
- forming a signal plane portion comprising a plurality of metal layers for transmitting a signal;
- forming a plurality of signal vias in the signal plane portion, the plurality of signal vias respectively extending from a surface of the signal plane portion into the signal plane portion;
- forming a power plane portion comprising a plurality of metal layers for providing power;
- overlaying the power plane portion with the signal plane portion through a connection layer, wherein the surface of the signal plane portion faces away from the power plane portion; and
- forming a plurality of power vias in the signal plane portion and the power plane portion, the plurality of power vias respectively extending from the surface of the signal plane portion to a surface of the power plane portion facing away from the signal plane portion, wherein a radial dimension of each of the plurality of signal vias is smaller than a radial dimension of each of the plurality of power vias.

Example 8

The method of example 7, wherein the signal plane portion is formed during a first lamination process, the power plane portion is formed during a second lamination process, and the signal plane portion and the power plane portion are overlaid together through the connection layer during a third lamination process.

Example 9

The method of example 7, wherein at least one signal via of the plurality of signal vias extends from the surface of the signal plane portion to a metal layer, that is adjacent to the connection layer, of the plurality of metal layers of the signal plane portion.

Example 10

The method of any of examples 7 to 9, wherein forming the signal plane portion further comprises: forming a plurality of capacitive load pads in the plurality of metal layers of the signal plane portion, the plurality of capacitive load pads being adapted to be electrically connected to at least a part of the plurality of signal vias.

Example 11

The method of example 10, wherein at least one pair of adjacent signal vias of the plurality of signal vias are respectively connected to at least two capacitive load pads of the plurality of capacitive load pads, each pair of adjacent signal vias of the at least one pair of adjacent signal vias comprises a first signal via and a second signal via, the at least two capacitive load pads connected by the first signal via are offset in a direction away from the corresponding second signal via, and the at least two capacitive load pads connected by the second signal via are offset in a direction away from the corresponding first signal via.

Example 12

The method of example 11, wherein each of the plurality of capacitive load pads is elliptical,
wherein each of the at least two capacitive load pads connected by the first signal via has a first end and a second end along a long axis direction, the first end is closer to the second signal via than the second end, and the first end is closer to the first signal via than the second end, and
wherein each of the at least two capacitive load pads connected by the second signal via has a third end and a fourth end along a long axis direction, the third end is closer to the first signal via than the fourth end, and the third end is closer to the second signal via than the fourth end.

Various embodiments of the present disclosure have been described above, which are examples and not exhaustive, and are not limited to the embodiments disclosed. Modifications and variations will be apparent to those of ordinary skill in the art without departing from the scope and spirit of the illustrated embodiments. The selection of the terms used herein is intended to best explain the principles of the embodiments, practical applications, or technical improvements in the marketplace, or to enable other ordinary skill in the art to understand the embodiments disclosed herein.

We claim:
1. A printed circuit board (100), comprising:
a signal plane portion (110) comprising a plurality of metal layers (140) for transmitting a signal;
a power plane portion (120) overlaid with the signal plane portion (110) through a connection layer (130) and comprising a plurality of metal layers (140) for providing power;
a plurality of power vias (160) each extending from a surface of the signal plane portion (110) facing away from the power plane portion (120), through the signal plane portion (110), the connection layer (130), and the power plane portion (120), to a surface of the power plane portion (120) facing away from the signal plane portion (110);
a plurality of signal vias (161) each extending from a surface of the signal plane portion (110) facing away from the power plane portion (120) into the signal plane portion (110) and not into the power plane portion (120), wherein a radial dimension of each of the plurality of signal vias (161) is smaller than a radial dimension of each of the plurality of power vias (160); and
a plurality of capacitive load pads (180) being formed in the plurality of metal layers (140) of the signal plane portion (110) and being electrically connected to at least a part of the plurality of signal vias (161),
wherein at least one pair of adjacent signal vias of the plurality of signal vias (161) are respectively connected to at least two capacitive load pads of the plurality of capacitive load pads (180), each pair of adjacent signal vias of the at least one pair of adjacent signal vias comprises a first signal via and a second signal via, the at least two capacitive load pads connected by the first signal via are offset in a direction away from the corresponding second signal via, and the at least two capacitive load pads connected by the second signal via are offset in a direction away from the corresponding first signal via.

2. The printed circuit board (100) of claim 1, wherein the signal plane portion (110) is formed during a first lamination process, the power plane portion (120) is formed during a second lamination process, and the signal plane portion (110) and the power plane portion (120) are overlaid together through the connection layer (130) during a third lamination process, and
wherein the plurality of signal vias (161) are formed in the signal plane portion (110) after the first lamination process and before the third lamination process, and the plurality of power vias (160) are formed in the signal plane portion (110) and the power plane portion (120) after the third lamination process.

3. The printed circuit board (100) of claim 1, wherein at least one signal via (161) of the plurality of signal vias (161) extends from a surface of the signal plane portion (110) facing away from the power plane portion (120) to a metal layer (140), that is adjacent to the connection layer (130), of the plurality of metal layers (140) of the signal plane portion (110).

4. The printed circuit board (100) of claim 1, wherein each of the plurality of capacitive load pads (180) is elliptical,
wherein each of the at least two capacitive load pads connected by the first signal via has a first end (181) and a second end (182) along a long axis direction, the first end (181) is closer to the second signal via than the second end (182), and the first end (181) is closer to the first signal via than the second end (182), and
wherein each of the at least two capacitive load pads connected by the second signal via has a third end (183) and a fourth end (184) along a long axis direction, the third end (183) is closer to the first signal via than the fourth end (184), and the third end (183) is closer to the second signal via than the fourth end (184).

5. A method for manufacturing the printed circuit board (100) of claim 1, comprising:
forming the signal plane portion (110) comprising the plurality of metal layers (140) for transmitting a signal;
forming the plurality of signal vias (161) in the signal plane portion (110), the plurality of signal vias (161) respectively extending from the surface of the signal plane portion (110) into the signal plane portion (110);
forming the power plane portion (120) comprising the plurality of metal layers (140) for providing power;
overlaying the power plane portion (120) with the signal plane portion (110) through the connection layer (130), wherein the surface of the signal plane portion (110) faces away from the power plane portion (120); and
forming the plurality of power vias (160) in the signal plane portion (110) and the power plane portion (120), the plurality of power vias (160) respectively extending from the surface of the signal plane portion (110) to the surface of the power plane portion (120) facing away from the signal plane portion (110), wherein the radial dimension of each of the plurality of signal vias (161) is smaller than the radial dimension of each of the plurality of power vias (160).

6. The method of claim 5, wherein the signal plane portion (110) is formed during a first lamination process, the power plane portion (120) is formed during a second lamination process, and the signal plane portion (110) and the power plane portion (120) are overlaid together through the connection layer (130) during a third lamination process.

7. The method of claim 5, wherein at least one signal via (161) of the plurality of signal vias (161) extends from the surface of the signal plane portion (110) to a metal layer (140), that is adjacent to the connection layer (130), of the plurality of metal layers (140) of the signal plane portion (110).

8. The method of claim 5, wherein forming the signal plane portion (110) further comprises: forming the plurality of capacitive load pads (180) in the plurality of metal layers (140) of the signal plane portion (110), the plurality of capacitive load pads (180) being adapted to be electrically connected to at least a part of the plurality of signal vias (161).

9. The method of claim 8, wherein the at least one pair of adjacent signal vias of the plurality of signal vias (161) are respectively connected to the at least two capacitive load pads of the plurality of capacitive load pads (180), each pair of adjacent signal vias of the at least one pair of adjacent signal vias (161) comprises the first signal via and the second signal via, the at least two capacitive load pads connected by the first signal via are offset in the direction away from the corresponding second signal via, and the at least two capacitive load pads connected by the second signal via are offset in the direction away from the corresponding first signal via.

10. The method of claim 9, wherein each of the plurality of capacitive load pads (180) is elliptical,
wherein each of the at least two capacitive load pads connected by the first signal via has a first end (181) and a second end (182) along a long axis direction, the first end (181) is closer to the second signal via than the second end (182), and the first end (181) is closer to the first signal via than the second end (182), and
wherein each of the at least two capacitive load pads connected by the second signal via has a third end (183) and a fourth end (184) along a long axis direction, the third end (183) is closer to the first signal via than the fourth end (184), and the third end (183) is closer to the second signal via than the fourth end (184).

11. The method of claim 6, wherein forming the signal plane portion (110) further comprises: forming the plurality of capacitive load pads (180) in the plurality of metal layers (140) of the signal plane portion (110), the plurality of capacitive load pads (180) being adapted to be electrically connected to at least a part of the plurality of signal vias (161).

12. The method of claim 11, wherein the at least one pair of adjacent signal vias of the plurality of signal vias (161) are respectively connected to the at least two capacitive load pads of the plurality of capacitive load pads (180), each pair of adjacent signal vias of the at least one pair of adjacent signal vias (161) comprises the first signal via and the second signal via, the at least two capacitive load pads connected by the first signal via are offset in the direction away from the corresponding second signal via, and the at least two capacitive load pads connected by the second signal via are offset in the direction away from the corresponding first signal via.

13. The method of claim 7, wherein forming the signal plane portion (110) further comprises: forming the plurality of capacitive load pads (180) in the plurality of metal layers (140) of the signal plane portion (110), the plurality of capacitive load pads (180) being adapted to be electrically connected to at least a part of the plurality of signal vias (161).

14. The method of claim 13, wherein the at least one pair of adjacent signal vias of the plurality of signal vias (161) are respectively connected to the at least two capacitive load pads of the plurality of capacitive load pads (180), each pair of adjacent signal vias of the at least one pair of adjacent signal vias (161) comprises the first signal via and the second signal via, the at least two capacitive load pads connected by the first signal via are offset in the direction away from the corresponding second signal via, and the at least two capacitive load pads connected by the second signal via are offset in the direction away from the corresponding first signal via.

* * * * *